United States Patent [19]

Burrus

[11] 4,314,252

[45] Feb. 2, 1982

[54] PREAMPLIFIER FOR ADF LOOP ANTENNA

[75] Inventor: Thomas W. Burrus, Cedar Rapids, Iowa

[73] Assignee: Rockwell International Corporation, El Segundo, Calif.

[21] Appl. No.: 206,763

[22] Filed: Nov. 14, 1980

[51] Int. Cl.³ ............................................... G01S 5/02
[52] U.S. Cl. ................................. 343/113 R; 343/119
[58] Field of Search ........... 343/113 R, 117 R, 117 A, 343/119, 120, 121

[56] References Cited

U.S. PATENT DOCUMENTS 3,686,671 8/1972 Holley, Jr. ..................... 343/117 R Primary Examiner—Theodore M. Blum
Attorney, Agent, or Firm—Terry M. Blackwood; Richard A. Bachand; H. Fredrick Hamann

[57] ABSTRACT

An antenna and preamplifier system suitable for use with airborne ADF equipment. Each of two orthogonally oriented loop antennas feed a different one of two preamplifiers. Each preamplifier includes an impedance establishing network and a pair of negative feedback amplifiers operating in push-pull.

15 Claims, 5 Drawing Figures

PREAMPLIFIER FOR ADF LOOP ANTENNA

This invention relates to antenna preamplifiers, and particularly to those suitable for application in airborne automatic direction finders.

The principles of airborne automatic direction finding (ADF) systems are well known in the art. See for example U.S. Pat. No. 4,158,843. Briefly, in an airborne ADF system, two orthogonally oriented loop antennas deliver voltages indicative respectively of cosine and sine of bearing to transmitter, and the receiver determines bearing as $\theta =$ arctan (sine loop voltage/cosine loop voltage). A separate sense channel resolves ambiguity. Typical ADF systems operate over a frequency range of about 190 kHz to about 1.75 MHz.

To avoid introducing undue error terms into the bearing information, the preamplifiers into which the loop antennas feed should be closely matched over time, temperature, and component variations for characteristics such as gain, phase versus frequency, input impedance, and output impedance. Simultaneously, suitable noise figure and intermodulation should be achieved.

Figure 1:
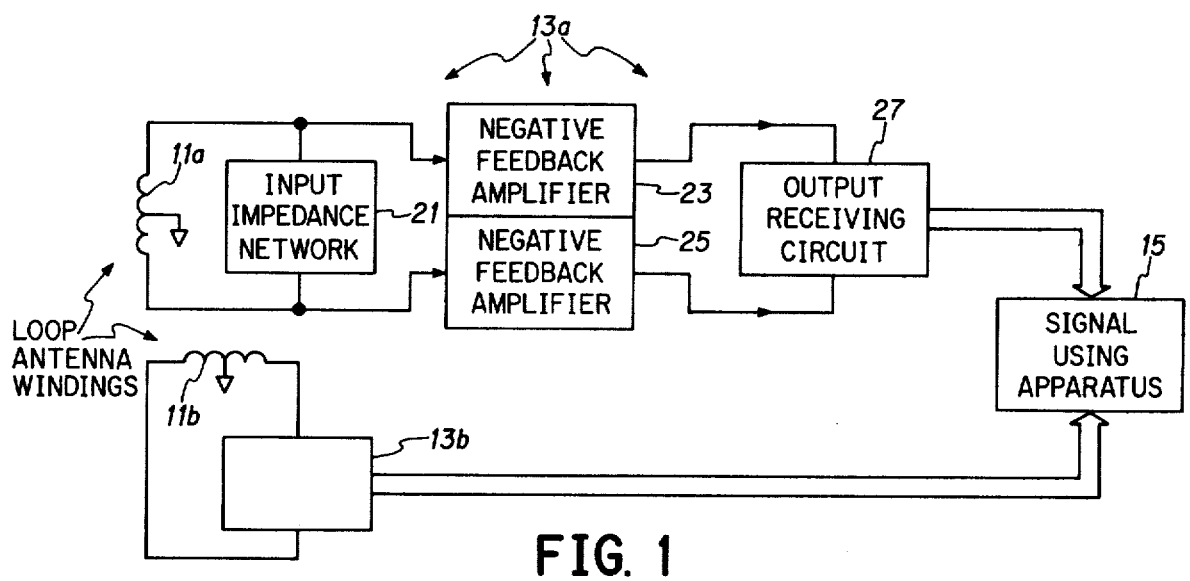
Figure 2:
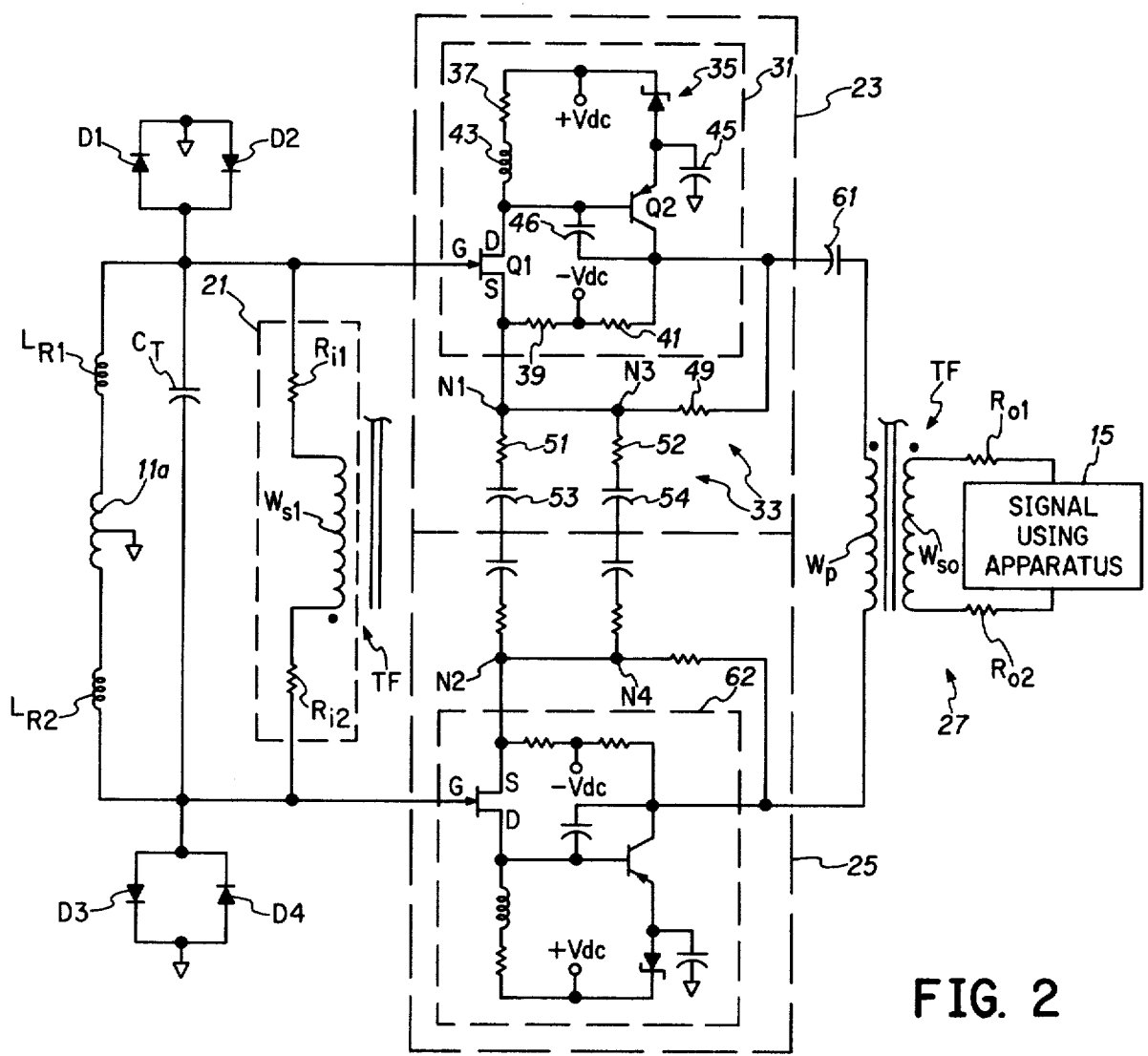
Figure 3:
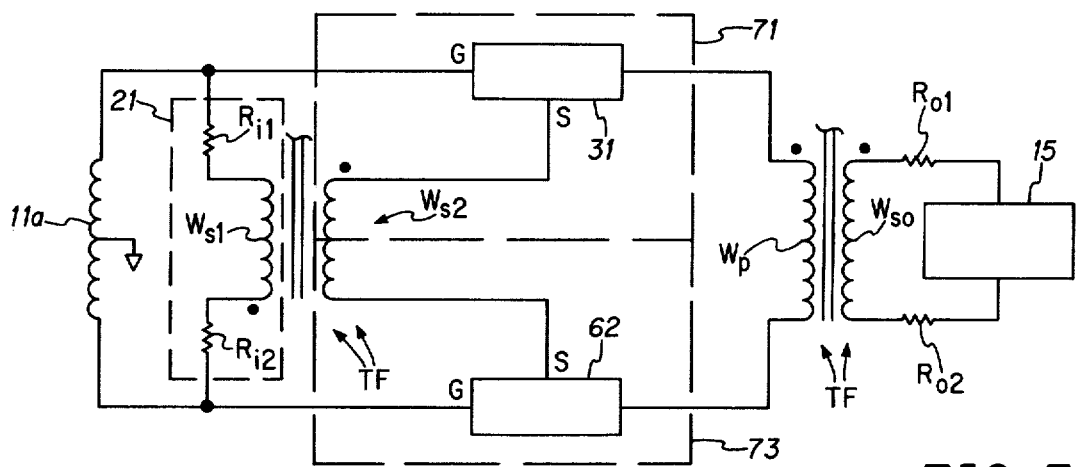
Figure 4:
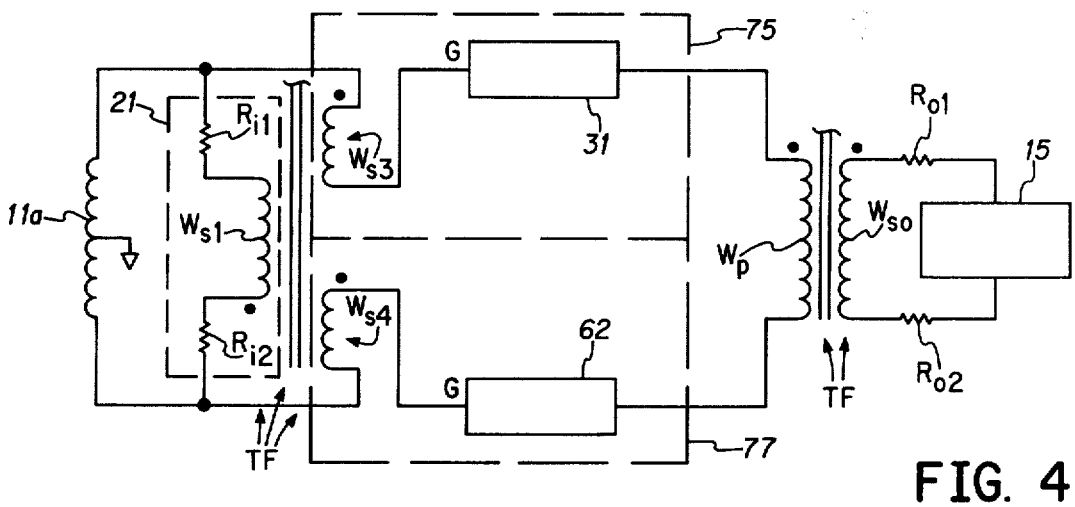
Figure 5:
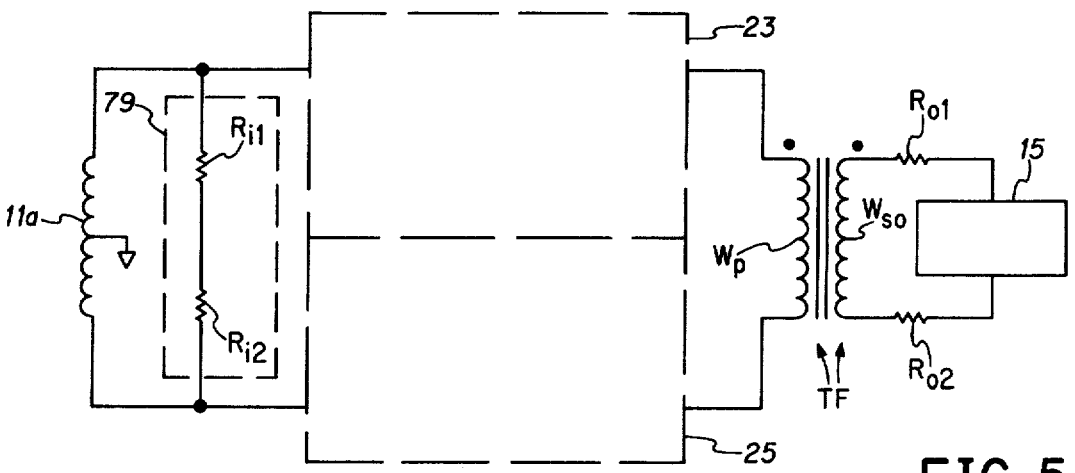

Thus, in accordance with the present invention, there is featured the provision of an antenna preamplifier which has improved characteristics in the above-identified areas and which is suitable for use as an ADF loop antenna preamplifier. These and other features, aspects, and advantages will become more apparent upon reference to the following specification, claims, and appended drawings in which:

FIG. 1 is a block diagram schematic representing an ADF antenna and preamplifier system including the presently preferred inventive embodiment, FIG. 2 is a schematic showing the presently preferred implementation of a portion of the FIG. 1 system, and FIGS. 3, 4, and 5 are schematics representing implementations alternative to that shown in FIG. 2.

Referring now to FIG. 1, two orthogonally oriented ADF loop antenna windings 11a and 11b deliver signal to substantially identical preamplifiers 13a and 13b which in turn provide output to signal using apparatus 15. As verified by the above referenced patent, and others such as U.S. Pat. No. 3,967,280, apparatus 15 typically comprises a pair of modulators (one for each antenna and preamp path), a signal combiner, RF, IF, detectors, and a bearing indicator. In accordance with the present invention, preamplifier 13a comprises an input impedance establishing network 21 connected for receiving excitation from opposite ends of loop antenna winding 11a, a pair of substantially matched gain negative feedback amplifiers 23 and 25 operating in push-pull and connected for receiving excitation from opposite ends of winding 11a, and an output receiving circuit 27 for receiving and combining the outputs of negative feedback amplifiers 23 and 25. Preamplifier 13b is duplicative of 13a and thus is concisely represented in FIG. 1 without repetitive detail.

Turning now to FIG. 2, negative feedback amplifiers 23 and 25 are seen to be alike and thus only 23 will be described in detail. More particularly, negative feedback amplifier 23 comprises an amplifier 31 having high open loop voltage gain and further comprises a resistive feedback network 33. Amplifier 31 comprises two cascaded stages of gain, the first or input stage comprising a JFET transistor Q1 and the second stage comprising a bipolar transistor Q2. The JFET gate electrode G is provided input via electrical communication with one end of winding 11a while the JFET drain electrode D provides first stage output to the second stage input, namely, the base of transistor Q2. Amplifier 31 output is taken from the collector of transistor Q2. Zener diode 35, $+V_{dc}$, $-V_{dc}$, and resistors 37, 39, and 41 serve to properly bias the two transistors Q1 and Q2. Inductance 43 serves primarily as a high impedance load for the drain of Q1. Capacitor 45 aids in presenting a low ac impedance to the Q2 emitter. Capacitor 46 is used as a safeguard in the preferred implementation to ensure stabilization and to ensure prevention of oscillation, ringing, and/or undesirable frequency response shaping. Feedback signal is provided from Q2 collector back to Q1 source S via network 33 which comprises resistors 49, 51, and 52. Capacitor 53 serves primarily as a dc blocking capacitor. Capacitor 54 has a high-pass effect and permits resistor 52 to have greater influence on amplifier gain at the high end of the operating frequency range. More particularly, the series connected combination of resistor 52 and capacitor 54 effects gain and phase versus frequency shaping at the extreme high end of the ADF band up to 1.75 MHz. The effect is to increase the preamplifier gain at the high end of the band where the loop output decreases somewhat and thus the combination of loop and preamplifier has more nearly the ideal cascade gain and phase at the higher frequencies.

It should here be pointed out that certain liberties are taken in the FIG. 2 drawing to accommodate explanation and illustration. For example, only one zener diode 35 and capacitor 35 need be used when the transistor emitters in both 23 and 25 are tied together. Also, the series connection of two resistors and two capacitors between points N1 and N2 is usually replaced by a single resistor series connected with a single capacitor. Of course, the replacement resistance value is twice that of resistor 51 and the replacement capacitor value is one-half that of capacitor 53. Likewise, the two resistors and two capacitors between points N3 and N4 are usually replaced with an appropriately valued single resistor and single capacitor.

As mentioned above, the open loop voltage gain of amplifier 31 is quite high. Feedback is also quite high, the feedback percentage being in the range of about 24.66% to 24.71%. The feedback percentage is sufficiently high to be the predominant and determining factor in establishing the voltage gain of the negative feedback amplifier 23. The gains of negative feedback amplifiers 23 and 25 are closely matched. Moreover, the gains of preamplifiers 13a and 13b are closely matched and track one another over the operating frequency range to about 1.5%.

Other details of preamplifier 23 are as follows. FET transistor Q1 is a Model U310 JFET transistor. Transistor Q2 is a Model 2N2907A PNP transistor. Zener diode is a Model 1N750A, 4.7 volt zener diode. $|V_{dc}| = 12$ volts dc. Inductance 43 is a 10 mH choke. The values of resistors 37, 39, 41, 49, 51, and 52 are respectively, 402 ohms, 1.33 kohms, 1.33 kohms, 147 ohms, 50 ohms, and 201 ohms. The values of capacitors 53, 45, 46, and 54 are respectively 0.2 uf, 0.1 uf, 3 pf, and 440 pf.

It should also be pointed out that resistors 49 and 51 are precision resistors having tolerances of ±0.1%. This feature, by making the feedback percentage very consistent, enables the desired matching to be achieved between the two preamplifiers 13a and 13b of FIG. 1. Amplifiers 23 and 25 are also matched but such matching is less important than matching between preamplifiers 13a and 13b. Also, resistor 52 and the capacitor 54 affect the feedback percentage, especially at the high end of the operating frequency band. Thus, a ±1% tolerance resistor is used for resistor 52, and a ±10% tolerance capacitor is used for capacitor 54. Also, resistors 39 and 41 serve as biasing resistors, and resistor 39 has some small effect on the feedback percentage. Resistor 41 is in parallel with one-half of the $W_p$ winding of transformer TF and constitutes a small output load. Thus, ±1% tolerance resistors are employed for resistors 39 and 41.

As above mentioned, negative feedback amplifiers 23 and 25 are alike, and the same components and values are used in both. Likewise, preamplifiers 13a and 13b are alike, and the same components and values are used in both.

Still referring to FIG. 2, output receiving circuit 27 is seen to preferably comprise a transformer TF having primary winding $W_p$ connected across the outputs of 23 and 25, and further having output secondary winding $W_{so}$ feeding output-impedance-establishing resistors $R_{o1}$ and $R_{o2}$. Capacitor 61 serves primarily as a dc blocking capacitor and is typically valued at 0.39 uf. Due to the above-described negative feedback, the impedance at output winding $W_{so}$ is very low, thus enabling output impedance to be set to high accuracy by $R_{o1}$ and $R_{o2}$ which in the preferred application are each 36.5 ohms.

As also seen from FIG. 2, input impedance establishing network 21 comprises two resistors $R_{i1}$ and $R_{i2}$, each series connected with a secondary winding $W_{s1}$ of transformer TF. In the preferred application, $R_{i1}$ and $R_{i2}$ are each 3570 ohms. The preamplifier input impedance is determined by the value of $R_{i1}$ and $R_{i2}$ and also by the magnitude of voltage induced in $W_{s1}$.

Transformer TF is a trifilar wound transformer using No. 34 trifilar magnet wire and comprising twenty turns on a TC-9 core, said core comprising a toroidal ferrite material whose permeability is about 2000. The resulting turns ratio of $W_p$ to $W_{so}$ to $W_{s1}$ is thus 1:1:1. Phasing of the windings is shown in FIG. 2 using the usual convention of dots.

The loop antenna winding 11a comprises part of a Rockwell/Collins ADF antenna, Model DFA-701, and typically has an inductance of 1.4 mH. Diodes D1, D2, D3, and D4, which are connected in opposing-shunted-mate pairs between the FET inputs and ground, provide protection from transients by clipping off destructive voltage transients which may occur during thunder storms. Each of these diodes is presently a Model 1N4454. The two inductances $L_{R1}$ and $L_{R2}$ low-pass filter out powerful UHF pulses from other navigation gear on the aircraft. Each of $L_{R1}$ and $L_{R2}$ is usually a coil in series with a ferrite bead and each is typically 0.15 μH.

A capacitor $C_T$ is connected across loop antenna winding 11a of FIG. 2 for the purpose of tuning the loop-circuit combination to exactly 577 kHz. Capacitor $C_T$ is generally a test select part and its value of capacitance effects compensation for variation of loop, preamplifier, and wiring capacity as well as loop inductance variations.

The loop antenna windings are center-tap grounded to provide a dc return path to ground for the preamplifier inputs. This helps also to provide common-mode rejection to the E field which also bears upon the loop. Such center-tap grounding also aids in providing better loop nulls.

Turning now to FIGS. 3, 4, and 5, therein are shown exemplary alternatives to the FIG. 2 implementation. FIG. 2 designators are also used in FIGS. 3, 4, and 5 to refer to like elements. Referring specifically to FIG. 3, the only changes relative to FIG. 2 involve the negative feedback amplifiers 71 and 73, and more specifically involve the feedback providing means portion thereof. More particularly, instead of using the resistive feedback network of the FIG. 2 illustrated implementation, the FIG. 3 implementation includes a further secondary winding $W_{s2}$ on transformer TF and employs $W_{s2}$ in negative feedback amplifiers 71 and 73 to provide feedback to the FET source electrodes of amplifiers 31 and 62. That is, $W_{s2}$ is connected between the source electrodes of amplifiers 31 and 62 and provides series-voltage feedback. A capacitor in series with the winding $W_{s2}$ may be desirable to provide dc blocking.

Somewhat analogous to the FIG. 3 changes, the only changes in FIG. 4 relative to FIG. 2 involve the negative feedback amplifiers 75 and 77 and more specifically involve the feedback providing means portion thereof. More particularly, the FIG. 4 implementation does not use the resistive feedback network of the FIG. 2 implementation, but instead includes two additional secondary windings $W_{s3}$ and $W_{s4}$ on transformer TF, and employs these two windings in negative feedback amplifiers 75 and 77 to provide feedback to the FET gate electrodes of amplifiers 31 and 62. That is, $W_{s3}$ is connected between one end of winding 11a and the gate electrode of amplifier 31, while winding $W_{s4}$ is connected between the other end of winding 11a and the gate electrode of amplifier 62. $W_{s3}$ and $W_{s4}$ provide series-voltage feedback.

Referring specifically to FIG. 5, the only changes relative to FIG. 2 involve the input impedance establishing network 79. More particularly, there is no transformer secondary winding connected in series with resistors $R_{i1}$ and $R_{i2}$. Additionally, the values of $R_{i1}$ and $R_{i2}$ are decreased to compensate for the absence of the secondary winding, and of course may be combined into a single resistor of appropriate value.

Further exemplary, suitable combinations of the above described individual modifications will yield additional variations. It will of course be appreciated that these or other modifications may increase or decrease suitability and/or practicality depending upon the particular application.

Thus while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. For use with an automatic direction finder, an antenna and preamplifier system comprising:
    (i) two loop antenna windings,
    (ii) two substantially matched gain preamplifiers, each being associated with a different one of said antenna windings, each preamplifier comprising:
        (a) an input impedance establishing network having input means connected for receiving excitation from opposite ends of the preamplifier-associated antenna winding,
        (b) a pair of negative feedback amplifiers for operating in push-pull relationship and having input means connected for receiving excitation from opposite ends of the preamplifier-associated antenna winding, and (c) an output receiving means having input means connected for receiving excitation from the negative feedback amplifier pair.

2. A system as defined in claim 1 wherein said output receiving means comprises a transformer having a primary winding connected for receiving excitation from said negative feedback amplifier pair.

3. A system as defined in claim 2 wherein the input impedance network includes resistance of predetermined value.

4. A system as defined in claim 3 wherein said transformer has a first secondary winding, and wherein said input impedance network comprises said resistance of predetermined value and said first secondary winding connected in series.

5. A system as defined in claim 2 wherein each negative feedback amplifier comprises (i) an amplifier with high open loop voltage gain and (ii) means for providing feedback to said amplifier in an amount sufficient for establishing the voltage gain of the negative feedback amplifier.

6. A system as defined in claim 5 wherein said feedback providing means comprises a network of resistors.

7. A system as defined in claim 6 wherein said resistors are precision resistors.

8. A system as defined in claim 5 wherein said transformer further includes one or more secondary windings additional to said first secondary winding, and wherein said feedback providing means comprises one or more of said additional secondary windings.

9. A system as defined in claim 5 wherein said amplifier with high open loop voltage gain includes a FET transistor connected for receiving, at its gate electrode, excitation from the antenna winding, and further connected for receiving, at its source electrode, feedback derived from amplifier output.

10. A system as defined in claim 5 wherein said amplifier with high open loop voltage gain comprises at least two cascaded amplification stages.

11. A system as defined in claim 10 wherein the first stage comprises a FET transistor.

12. A system as defined in claim 11 wherein said FET transistor is connected for receiving, at its gate electrode, excitation from the antenna winding.

13. A system as defined in claim 12 wherein the second stage comprises a bipolar transistor.

14. A system as defined in claim 12 wherein said feedback providing means comprises a resistive network connected for providing feedback to the source electrode of said FET transistor.

15. A system as defined in claim 12 wherein said transformer further includes one or more secondary windings additional to said first secondary winding, and wherein said feedback providing means comprises one or more of said additional windings connected for supplying feedback to a predetermined one, or both, of the gate electrode and the source electrode, of the FET transistor.

* * * * *